United States Patent [19]

Murayama

[11] Patent Number: 5,099,308
[45] Date of Patent: Mar. 24, 1992

[54] SEMICONDUCTOR DEVICE HAVING REVERSE CONDUCTIVITY-TYPE DIFFUSION LAYER AND SEMICONDUCTOR WIRING LAYER CONNECTED BY METALLIC CONNECTION WIRING LAYER

[75] Inventor: Motoaki Murayama, Tokyo, Japan

[73] Assignee: NEC Corporation, Japan

[21] Appl. No.: 592,689

[22] Filed: Oct. 3, 1990

[30] Foreign Application Priority Data

Oct. 4, 1989 [JP] Japan .................. 1-260416

[51] Int. Cl.$^5$ ............... H01L 23/48; H01L 29/34; H01L 29/04; H01L 29/40
[52] U.S. Cl. ........................ 357/71; 357/52; 357/59; 357/65; 357/68
[58] Field of Search ............ 357/59, 68, 71, 52, 357/65

[56] References Cited

U.S. PATENT DOCUMENTS

| 4,121,240 | 10/1978 | Katto | 357/71 |
| 4,712,291 | 12/1987 | McLevige | 357/71 |
| 4,903,096 | 2/1990 | Masuoka et al. | 357/71 |
| 4,954,871 | 9/1990 | Mizutani et al. | 357/71 |

Primary Examiner—Andrew J. James
Assistant Examiner—Cynthia S. Deal
Attorney, Agent, or Firm—Ostrolenk, Faber, Gerb & Soffen

[57] ABSTRACT

A semiconductor device comprising one conductivity type semiconductor substrate, a reverse conductivity type diffusion layer, a semiconductor wiring layer and a metal connection wiring layer, and said metal connection wiring layer is composed of a high melting metal film formed by a selective CVD method.

13 Claims, 2 Drawing Sheets

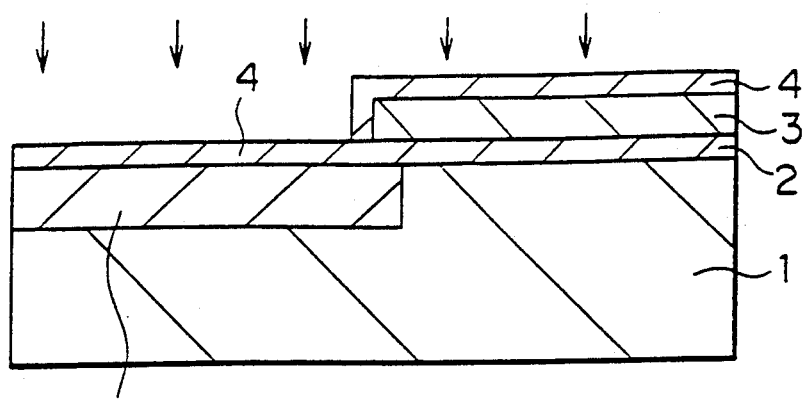
FIG. I(a)
PRIOR ART
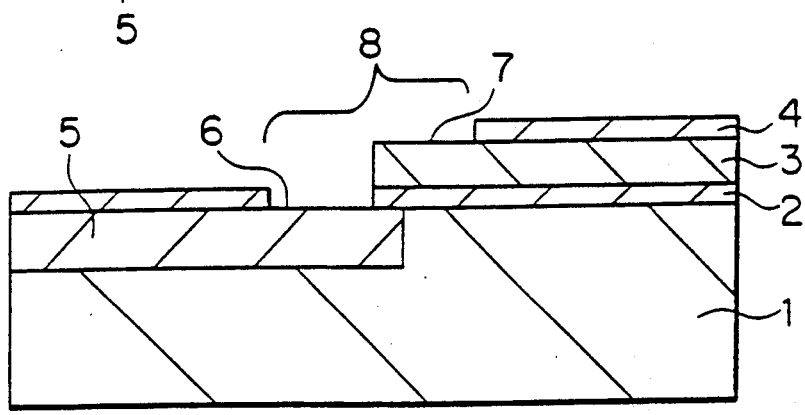
FIG. I(b)
PRIOR ART
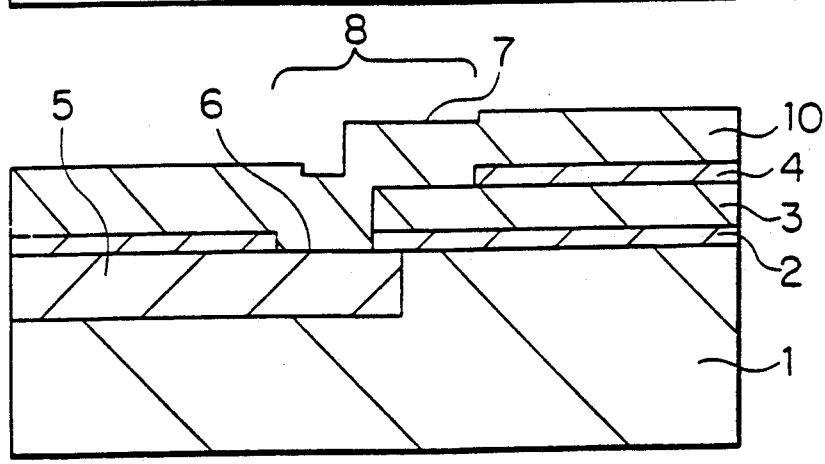
FIG. I(c)
PRIOR ART
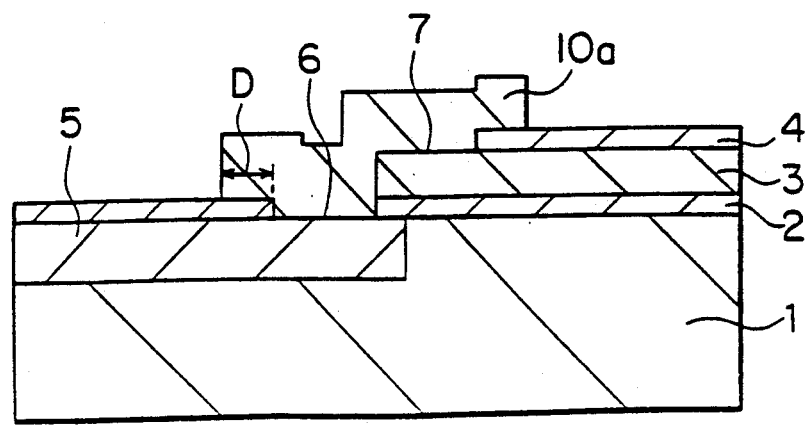
FIG. I(d)
PRIOR ART

SEMICONDUCTOR DEVICE HAVING REVERSE CONDUCTIVITY-TYPE DIFFUSION LAYER AND SEMICONDUCTOR WIRING LAYER CONNECTED BY METALLIC CONNECTION WIRING LAYER

BACKGROUND OF THE INVENTION

1. Field of the Invention

This invention relates to a semiconductor device and a method for manufacturing the same.

2. Description of the Prior Art

In the past, one conductivity type diffusion layer in a semiconductor substrate and a reverse conductivity type semiconductor wiring layer have been connected with a film of a metal such as aluminum or the like, in order to achieve ohmic contacts without forming any PN junction.

Now, a method for manufacturing the semiconductor device, wherein a P type diffusion layer formed on an N-type silicon substrate is connected with an N-type polycrystalline silicon wiring, will be described with reference to FIGS. 1 (a) to 1 (d).

First, as shown in FIG. 1 (a), a silicon oxide film 2 of about 20 nm thickness is formed on an N-type silicon substrate 1 and an N-type polycrystalline silicon wiring layer 3 of about 400 nm thickness is formed on the silicon oxide film 2, which is followed by being processed to patterning for forming wirings with a photolithographic technology. Then, the silicon oxide film 2 is removed to partially expose the silicon substrate. Thereafter, a silicon oxide film 4 is formed on the total surface of a silicon wafer and then, after ion implantation of boron on the surface of the N-type silicon substrate 1, a P-type diffusion layer 5 is formed by performing an annealing step. The boron ions are implanted in the direction of arrows as shown in FIG. 1 (a).

Then, as shown in FIG. 1 (b), the silicon oxide film 4, which covers a contact portion 6 on the surface of the P-type diffusion layer 5 and an adjacent connection portion 7 on the N-type polycrystalline silicon 3, is selectively removed to form an aperture portion 8.

Thereafter, as shown in FIG. 1 (c), an aluminum film 10 of about 600 nm thickness is formed on the total surface of the wafer.

Finally as shown in FIG. 1 (d), the aluminum film 10, except the film formed on the aperture portion 8 and the silicon oxide film 4 of the peripherally thereof, is subjected to a patterning process due to etching to form an aluminum connection wiring layer 10a which connects the contact portion 6 on the P-type diffusion layer 5 with the connection portion 7 on the N-type polycrystal silicon wiring layer 3.

In this case, the coverage length D of the aluminum connection wiring layer 10a on the silicon oxide film 4 is about 0.6 μm.

In the prior art semiconductor device and the method for manufacturing the same, as mentioned above, aluminum 10 is used to connect the diffusion layer with the semiconductor wiring and thus it is necessary to perform an alignment of aluminum 10a with the contact portion 6 and the connection portion 7 and then to perform an etching process. Therefore, there is a drawback that the manufacturing process becomes longer. In addition, there is another drawback that it is difficult to attain a high integration density due to the wide alignment margin.

In addition, formation of an inter-wiring insulating film which is formed to make additional wiring thereon is restricted to be only subjected to a heat treatment not higher than about 400° C. because the connection wiring 10a is composed of aluminum. Thus, there is an additional drawback that the freedom of the manufacturing is limited, causing a poor evenness of the wafer surface.

SUMMARY OF THE INVENTION

It is a major object of this invention to provide an improved semiconductor device which can be easily manufactured and having a high integration density.

It is an another object of this invention to provide an improved method for manufacturing the same.

The above object is accomplished by providing a semiconductor device comprising one conductivity type semiconductor substrate, a reverse conductivity type diffusion layer, an insulating film, one conductivity type semiconductor wiring layer and a metal connection wiring layer, said diffusion layer being selectively formed in said semiconductor substrate and having a contact portion on a part of the surface thereof, said semiconductor wiring layer being formed on the surface of said semiconductor substrate through said insulating film and having a connection portion adjacent to said contact portion and said metal connection wiring layer comprising of a high melting point metal and being formed on the surface of said contact portion and said connection portion.

The high melting point metal means a metal having a melting point higher than that of aluminum, and is any refractory metal such as technetium, molybdenum, tungsten, ruthenium, rhodium, osmium, iridium, or platinum for example. Tungsten is preferred.

Moreover, another object of this invention is accomplished by providing a method for manufacturing a semiconductor device which comprises a step of forming a connection wiring layer of a high melting point metal layer, according to a selective CVD method, on an aperture portion of a semiconductor wafer comprising one conductivity type semiconductor substrate, a reverse conductivity type diffusion layer, an insulating film and one conductivity type semiconductor wiring layer, said diffusion layer being selectively formed in the upper layer of said semiconductor substrate and having a contact portion on a part of the surface thereof, said semiconductor wiring layer being formed on the surface of said semiconductor substrate through said insulating film and having a connection portion adjacent said contact portion and said semiconductor insulating film covering the total surface except said aperture portion including said contact portion and said connecting portion.

BRIEF DESCRIPTION OF THE DRAWINGS

By way of embodiment of the many features and advantages of the invention, an illustrative embodiment in the form of a semiconductor device is described below and shown in the accompanying drawings, in which:

FIGS. 1 (a) to 1 (d) are a process chart illustrating one example of a method for manufacturing a conventional semiconductor device, each showing a sectional view of the semiconductor chip.

DETAILED DESCRIPTION OF THE PREFERRED EMBODIMENT

This invention will now be described with reference to the accompanying drawings.

Figure 2A:
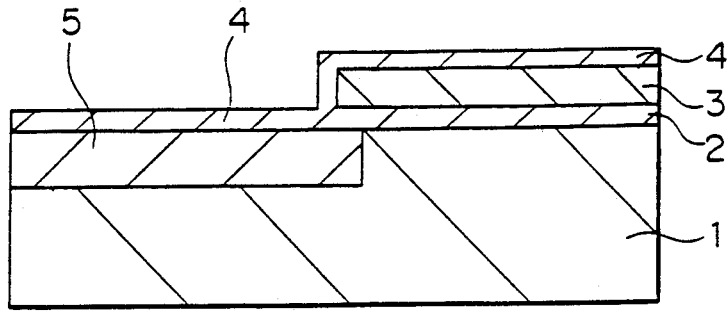
FIGS. 2 (a) to 2 (c) are a process chart illustrating a preferred embodiment of this invention, each showing a sectional view of the semiconductor chip.
Figure 2B:
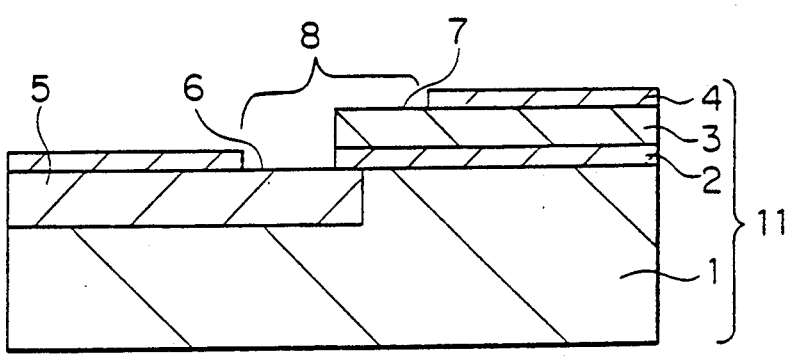
Figure 2C:
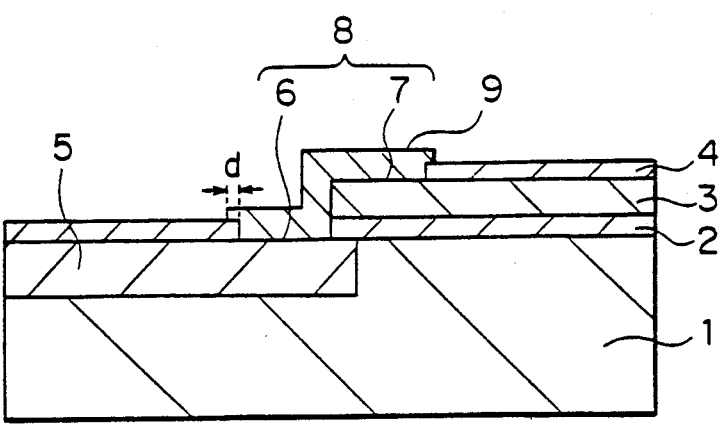

FIGS. 2 (a) to 2 (c) show a process chart illustrating the preferred embodiment of this invention, each showing a sectional view of the semiconductor chip.

According to the same process as the prior process as shown in the above FIGS. 1 (a) and 1 (b), a semiconductor wafer 11 as shown in FIGS. 2 (a) and 2 (b) is formed.

Then, according to a selective Chemical Vapor Deposition (CVD) method, a tungsten wiring layer 9 of about 200 nm thickness is grown selectively on the surface of an aperture portion 8 wherein silicon is exposed. Thus, a connection portion 7 of an N-type polycrystalline silicon wiring layer 3 is connected with a contact portion 6 of a P-type diffusion layer 5 through the wiring layer 9.

In this case, the prior patterning process schiered through etching is not necessary and in addition a coverage length d of the polycrystalline silicon wiring layer 3 on a silicon oxide film 4 is about 0.1 μm and is shorter than that of the prior art.

The above embodiment describes the connection between the P-type diffusion layer and N-type polycrystalline silicon wiring layer. This can be also applied to the connection between an N-type diffusion layer and a P-type polycrystalline silicon wiring layer and between a diffusion layer and a polycrystalline silicon wiring layer of the same conductivity type.

From the foregoing, it will be appreciated that with this invention wherein the connection between the diffusion layer and the semiconductor wiring layer is made by using a high melting point metal film which is obtained according to the selective CVD method, and wherein a patterning process utilizing etching is not required, it is possible to make the manufacturing process shorter than that of the prior art and to attain a higher integration density since the alignment margin is not needed.

In addition, because the inter-wiring film formed to make additional wiring thereon is allowed to be subjected to a heat treatment of about 800°–900° C. since the connection wiring in the lower wiring to the diffusion region comprises a the high melting point metal, the manufacturing process can be more arbitrarily designed and it becomes easy to ensure the evenness of the wafer surface.

What is claimed is:

1. A semiconductor device comprising a first conductivity type semiconductor substrate, a reverse conductivity type diffusion layer, an insulating film, a semiconductor wiring layer and a metal connection wiring layer, said diffusion layer being selectively formed in said semiconductor substrate and having a contact portion on a part of the surface thereof, said semiconductor wiring layer being formed on a surface of said semiconductor substrate above said insulating film and having a connection portion adjacent to said contact portion of the diffusion layer on an upper surface of the semiconductor wiring layer, said metal connection wiring layer comprising a high melting point metal formed on the surface of said contact portion above the contact portion and above the upper surface of said connection portion of said semiconductor wiring layer and in electrical contact with said contact portion and said connection portion.

2. A semiconductor device as claimed in claim 1, wherein said high melting point metal is a metal having a melting point much higher than that of aluminum.

3. A semiconductor device as claimed in claim 1, wherein said high melting point metal comprises tungsten.

4. A semiconductor device as claimed in claim 1, wherein the conductivity type of said diffusion layer is P-type and that of said semiconductor wiring layer is N-type.

5. A semiconductor device comprising an N-type silicon substrate, a P-type diffusion layer, a silicon oxide film, an N-type polycrystalline silicon wiring layer and a metal connection wiring layer, said diffusion layer being selectively formed in an upper layer of said silicon substrate and having a contact portion on a part of a surface thereof, said polycrystalline silicon wiring layer being formed on a surface of said silicon substrate above said silicon oxide film and having a connection portion adjacent to said contact portion of said diffusion layer on an upper surface of the polycrystalline silicon wiring layer, said metal connection wiring layer comprising tungsten formed on the surface on said contact portion above the contact portion and above the upper surface of said connection portion and in electrical contact with said contact portion and said connection portion.

6. A semiconductor device as claimed in claim 1, wherein the conductivity type of said diffusion layer is N-type and that of said semiconductor wiring layer is P-type.

7. A semiconductor device as claimed in claim 1, wherein the conductivity type of said diffusion layer and said semiconductor wiring layer is the same.

8. A semiconductor device comprising a first conductivity type semiconductor substrate, a reverse conductivity type diffusion layer selectively formed in an upper layer of said semiconductor substrate and having a contact portion on a part of a surface thereof, an insulating film above the substrate and the diffusion layer, said contact portion not being covered by said insulating film, said insulating film having a contact hole corresponding to said contact portion of said diffusion layer, a semiconductor wiring layer being of an electric conductivity type identical with said semiconductor substrate, and formed on said semiconductor substrate through said insulating film with an end portion of the semiconductor wiring layer substantially coinciding with an edge of the contact hole of said insulating film and having a connection portion adjacent to said contact portion, a further insulating film above said wiring layer, said connection portion of said semiconductor wiring layer not being covered by the further insulating film, and a metal connection wiring layer comprising a high melting point metal formed on said contact portion and said connection portion, and connection said contact portion to said connection portion.

9. A semiconductor device as claimed in claim 8, wherein said high melting point metal comprises a metal having a melting point much higher than that of aluminum.

10. A semiconductor device as claimed in claim 8, wherein said high melting point metal comprises tungsten.

11. A semiconductor device as claimed in claim 8, wherein the conductivity type of said diffusion layer is P-type and that of said semiconductor wiring layer is N-type.

12. A semiconductor device as claimed in claim 8, wherein the conductivity type of said diffusion layer is N-type and that of said semiconductor wiring layer is P-type.

13. A semiconductor device comprising an N-type semiconductor substrate, a P-type diffusion layer selectively formed in an upper layer of said N-type semiconductor substrate and having a contact portion on a part of a surface thereof, a silicon oxide insulating film above the substrate and the diffusion layer, said contact portion not being covered by the silicon oxide insulating film, said silicon oxide insulating film having a contact hole corresponding to said contact portion of said P-type diffusion layer, an N-type semiconductor wiring layer formed on said N-type semiconductor substrate through said silicon oxide insulating film with an end portion of said N-type semiconductor wiring layer substantially coinciding with an edge of said contact hole of said silicon oxide insulating film and having a connection portion adjacent to said contact portion, a further silicon oxide insulating film above said semiconductor wiring layer, said connection portion of said semiconductor wiring layer not being covered by the further silicon oxide insulating film, and a connection wiring layer comprising tungsten formed on said contact portion and said connection portion, and connecting said contact portion to said connection portion.

* * * * *